United States Patent
Uehara et al.

(10) Patent No.: US 10,458,042 B2
(45) Date of Patent: Oct. 29, 2019

(54) CALCIUM FLUORIDE MEMBER, METHOD FOR PRODUCING SAME, AND METHOD FOR PRESSURE-BONDING CALCIUM FLUORIDE CRYSTAL

(71) Applicant: NIKON CORPORATION, Tokyo (JP)

(72) Inventors: Naoyasu Uehara, Sagamihara (JP); Minako Azumi, Kawasaki (JP); Shitoka Suzuki, Sagamihara (JP)

(73) Assignee: NIKON CORPORATION, Tokyo (JP)

( * ) Notice: Subject to any disclaimer, the term of this patent is extended or adjusted under 35 U.S.C. 154(b) by 538 days.

(21) Appl. No.: 15/185,566

(22) Filed: Jun. 17, 2016

(65) Prior Publication Data

US 2016/0362814 A1 Dec. 15, 2016

Related U.S. Application Data

(63) Continuation of application No. PCT/JP2014/084075, filed on Dec. 24, 2014.

(30) Foreign Application Priority Data

Dec. 25, 2013 (JP) .................. 2013-267709

(51) Int. Cl.
*H01J 9/26* (2006.01)
*C30B 29/12* (2006.01)
*C30B 33/06* (2006.01)
*H01J 61/30* (2006.01)
*H01J 9/24* (2006.01)
*H01J 61/02* (2006.01)

(52) U.S. Cl.
CPC .............. *C30B 29/12* (2013.01); *C30B 33/06* (2013.01); *H01J 9/247* (2013.01); *H01J 61/025* (2013.01); *H01J 61/30* (2013.01); *H01J 61/302* (2013.01)

(58) Field of Classification Search
CPC .......... C30B 29/12; C30B 33/06; H01J 9/247; H01J 61/025; H01J 61/30; H01J 61/302
USPC ........................................... 313/636
See application file for complete search history.

(56) References Cited

U.S. PATENT DOCUMENTS

| 2006/0119247 A1* | 6/2006 | Tokai ............... H01J 9/20 313/493 |
| 2010/0123394 A1 | 5/2010 | Morimoto |
| 2011/0181191 A1* | 7/2011 | Smith ............... B82Y 10/00 315/149 |
| 2014/0079902 A1 | 3/2014 | Fujiwara et al. |

(Continued)

FOREIGN PATENT DOCUMENTS

| JP | 4-259269 | 9/1992 |
| JP | 7-50151 | 2/1995 |

(Continued)

OTHER PUBLICATIONS

International Search Report dated Mar. 24, 2015 in corresponding International Application No. PCT/JP2014/084075.

(Continued)

*Primary Examiner* — Christopher M Raabe (57) ABSTRACT

The calcium fluoride member includes a first member made from monocrystalline calcium fluoride and a second member made from monocrystalline or polycrystalline calcium fluoride. The first member and the second member is pressure-bonded together to form the calcium fluoride member.

13 Claims, 7 Drawing Sheets

(56) References Cited

U.S. PATENT DOCUMENTS

2015/0107768 A1\* 4/2015 Uehara .................. C01F 11/22
                                                        156/345.1
2016/0365237 A1\* 12/2016 Uehara .................. H01J 9/247

FOREIGN PATENT DOCUMENTS

| JP | 9-7550 | 1/1997 |
|----|--------|--------|
| JP | 9-124400 | 5/1997 |
| JP | 9-221342 | 8/1997 |
| JP | 1-064481 | 3/1998 |
| JP | 2005/235607 | 9/2005 |
| JP | 2006/327837 | 12/2006 |
| JP | 2008/300634 | 12/2008 |
| JP | 2009/163965 | 7/2009 |
| JP | 2010/123323 | 6/2010 |
| JP | 4-569872 | 10/2010 |
| WO | WO 2012/165334 | 12/2012 |

OTHER PUBLICATIONS

Taiwanese Office Action dated May 24, 2018, in corresponding Taiwanese Patent Application No. 103145367, 14 pgs.
International Search Report for PCT/JP2014/084075, dated Mar. 24, 2015.
Written Opinion of the International Search Authority for PCT/JP2014/084075, dated Mar. 24, 2015.

\* cited by examiner

| TARGET TEMPERATURE T (°C) | PRESSURE P (MPa) | | | | |
|---|---|---|---|---|---|
| | 1.5 | 2.1 | 3.6 | 5.8 | 7.2 |
| 100 | — | — | — | — | — |
| 200 | — | — | — | — | — |
| 300 | — | — | — | — | — |
| 400 | — | ○ | ○ | ○ | ○ |
| 500 | — | ○ | ○ | ○ | ○ |
| 600 | — | ○ | ○ | ○ | — |
| 700 | — | ○ | ○ | ○ | — |
| 800 | — | ○ | ○ | ○ | — |
| 900 | — | ○ | ○ | — | — |
| 1000 | ○ | ○ | ○ | — | — |
| 1100 | — | — | — | — | — |
| 1200 | — | — | — | — | — |

CALCIUM FLUORIDE MEMBER, METHOD FOR PRODUCING SAME, AND METHOD FOR PRESSURE-BONDING CALCIUM FLUORIDE CRYSTAL

CROSS-REFERENCE TO RELATED APPLICATIONS

This application is a Continuation Application of International Application No. PCT/JP2014/084075 claiming the conventional priority of Japanese patent Application No. 2013-267709 filed on Dec. 25, 2013, and titled "CALCIUM FLUORIDE MEMBER, METHOD FOR PRODUCING SAME, AND METHOD FOR PRESSURE-BONDING CALCIUM FLUORIDE CRYSTAL". The disclosures of Japanese patent Application No. 2013-267709 and International Application No. PCT/JP2014/084075 are incorporated herein by reference in their entirety.

TECHNICAL FIELD

The present disclosure relates to a calcium fluoride member, a method of producing the same, and a method of pressure-bonding calcium fluoride crystals. More particularly, the present disclosure relates to a calcium fluoride member that contains monocrystalline calcium fluoride, a method of producing the same, and a method of pressure-bonding calcium fluoride crystals together.

BACKGROUND ART

Monocrystalline calcium fluoride ($CaF_2$, flourite) exhibits high transmittance of a wide range of wavelengths of light, ranging from the vacuum ultraviolet region to the infrared region. Therefore, monocrystalline $CaF_2$ is widely used in various types of optical members, such as in the arc tubes of excimer lamps (Japanese Unexamined Patent Application Publication No. 2009-163965A), for example.

SUMMARY

However, monocrystalline $CaF_2$ has well-defined internal cleavage planes and therefore is prone to cleavage and splitting due to vibrations and impacts. As a result, it is difficult to machine monocrystalline $CaF_2$ into the various shapes required for different applications. An object of the present disclosure is to solve this problem by providing $CaF_2$ members of various shapes that can be easily produced using a simple process. Another object of the present disclosure is to provide a method of producing $CaF_2$ members that makes it possible to easily produce these $CaF_2$ members of various shapes as well as a method of pressure-bonding $CaF_2$ crystals together.

A first aspect of the present disclosure provides a calcium fluoride member, including:

a first member made from monocrystalline calcium fluoride; and a second member made from monocrystalline or polycrystalline calcium fluoride, the first member and the second member being pressure-bonded together to form the calcium fluoride member.

A second aspect of the present disclosure provides a method of producing a calcium fluoride member, the method including:

pressure-bonding together a first member made from monocrystalline calcium fluoride and a second member made from monocrystalline or polycrystalline calcium fluoride.

A third aspect of the present disclosure provides a method of pressure-bonding calcium fluoride crystals, the method including:

bringing a prescribed surface of a first member made from monocrystalline calcium fluoride into contact with a prescribed surface of a second member made from monocrystalline calcium fluoride or polycrystalline calcium fluoride so as to define a contact surface between the prescribed surfaces; and applying a pressure of 2.1 to 5.8 MPa to the contact surface in an atmosphere of 400 to 1100° C.

BRIEF DESCRIPTION OF DRAWINGS

FIGS. 1A to 1C illustrate an optical member according to an embodiment of the present disclosure.

FIGS. 7A and 7B illustrate an optical member according to another embodiment of the present disclosure.

EMBODIMENTS

Embodiment 1

Next, Embodiment 1 of the present disclosure will be described with reference to FIGS. 1A to 6.

Figure 1A:
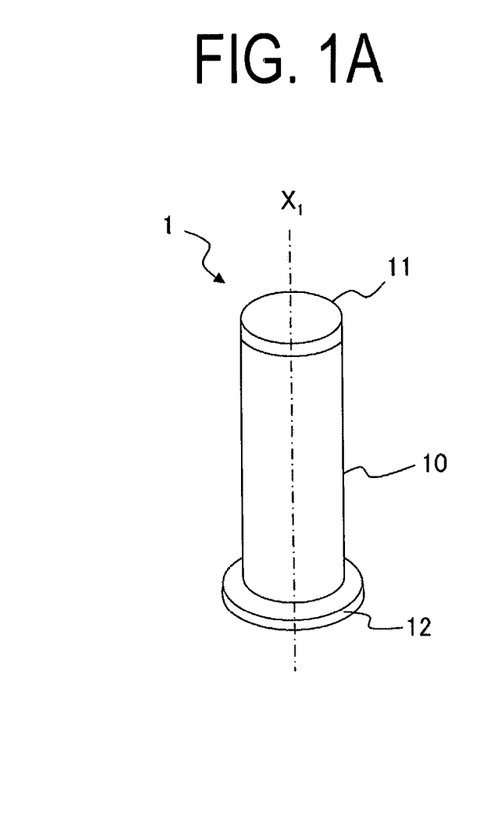
FIG. 1A is a perspective view.
Figure 1B:
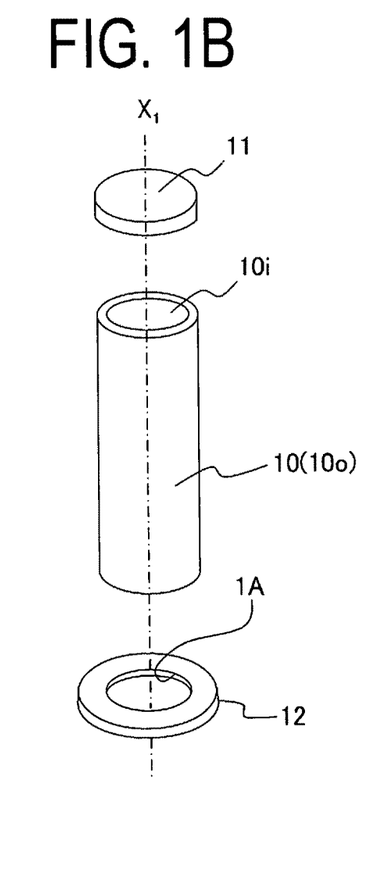
FIG. 1B is an exploded perspective view.

An optical member 1 according to the present embodiment is a $CaF_2$ tube that contains a gas therein and emits plasma light when this gas reaches a plasma state. As illustrated in FIGS. 1A and 1B, the optical member 1 includes a transparent member 10, a cap 11, and a flange 12.

The transparent member 10 is a hollow cylinder made from monocrystalline $CaF_2$, and an optical polishing process is applied to an outer surface 10o and an inner surface 10i of the transparent member 10. Like the transparent member 10, the cap 11 and the flange 12 are also made from monocrystalline $CaF_2$. As illustrated in FIG. 1B, the cap 11 is a disk-shaped member, and the flange 12 is a circular ring-shaped member with an opening 1A formed therein. In the optical member 1 according to the present embodiment, the diameter of the cap 11 is equal to the outer diameter of the transparent member 10, and the inner diameter of the transparent member 10 is equal to the inner diameter of the flange 12. The wall thickness of the transparent member 10 is not particularly limited but may be set to approximately 2 to 20 mm, for example. In the present specification, "monocrystalline $CaF_2$" refers not only to literal monocrystalline consists of a single crystal but also to $CaF_2$ crystals that include a countable number (on the order of approximately two or more) of discrete $CaF_2$ crystals and have substantially the same optical properties as monocrystalline $CaF_2$. Meanwhile, "polycrystalline $CaF_2$" refers to a crystal made from a large number of monocrystals; that is, a $CaF_2$ crystal made from microcrystals with grain boundaries therebetween.

Figure 1C:
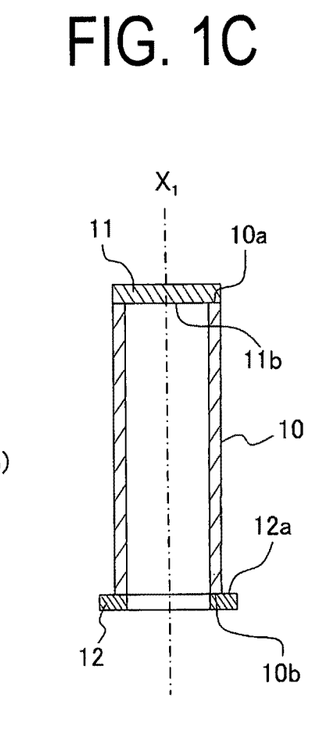
FIG. 1C is cross-sectional view taken along an axial direction.

The cap 11 and the flange 12 are pressure-bonded to the transparent member 10 using a pressure-bonding process (which will be described in more detail later) such that the cap 11 and the flange 12 are arranged coaxially along the center axis $X_1$ of the transparent member 10. More specifically, as illustrated in FIG. 1C, the cap 11 is pressure-bonded to the transparent member 10 at a contact surface formed between a top surface 10a of the transparent member 10 and a bottom surface 11b of the cap 11. Moreover, the flange 12 is pressure-bonded to the transparent member 10 at a contact surface formed between a bottom surface 10b of the transparent member 10 and a top surface 12a of the flange 12.

Figure 2:
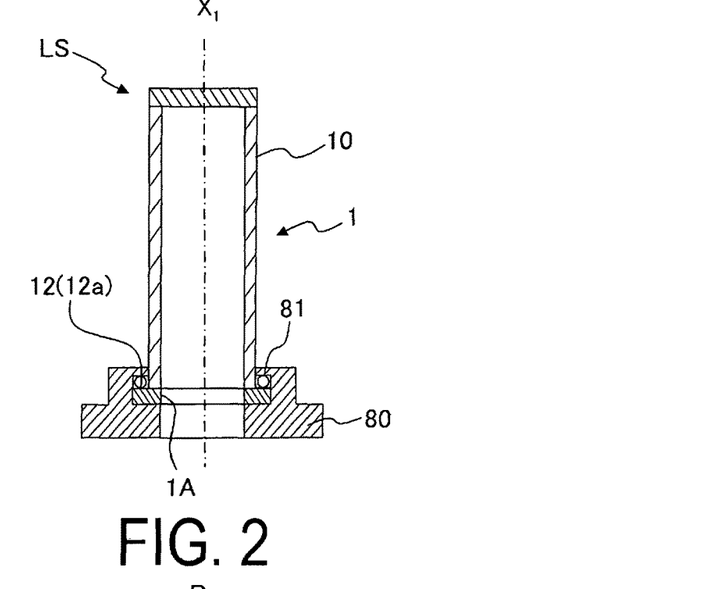
FIG. 2 is a cross-sectional view of a light source that includes the optical member according to the embodiment of the present disclosure.

The optical member 1 can be used in a variety of fields. In the semiconductor manufacturing equipment industry, for example, the optical member 1 can be used in the light source for an exposure device or in the light source for a wafer inspection device or the like. As illustrated in FIG. 2, when the optical member 1 is used as a light source LS for a wafer inspection device (not illustrated), the optical member 1 is supported by a metal support member 80. The support member 80 supports the optical member 1 both in the axial direction and circumferential direction of the transparent member 10 via the flange 12 of the optical member 1 and an O-ring 81 arranged on the top surface 12a of the flange 12. Including the O-ring 81 makes it possible to increase the strength of the airtight seal between the optical member 1 and the support member 80.

Next, the optical member 1 is filled with a gas via the opening 1A in the flange 12, and the opening 1A is sealed with a cap (not illustrated) in order to seal the gas within the optical member 1. The sealed gas is then irradiated with excitation light until the gas reaches a plasma state. The resulting plasma light emitted from the plasma-state gas can then be emitted to outside of the optical member 1 via the transparent member 10.

The optical member 1 having the shape described above makes it possible to construct a light source LS in which only one end of the optical member 1 is supported. In this light source LS, even if the transparent member 10 expands in the axis $X_1$ direction when the temperature of the optical member 1 increases due to the plasma and the plasma light, the optical member 1 can expand freely towards the free end thereof that is not supported by the support member 80 (that is, the top end in FIG. 2). Therefore, in the optical member 1 according to the present embodiment, the shape described above makes it possible to prevent stress caused by thermal expansion when the optical member 1 is in use as well as any associated damage such as cracking that might otherwise occur.

Next, a method of producing the optical member 1 according to the present embodiment will be described.

The monocrystalline $CaF_2$ material used for the transparent member 10, the cap 11, and the flange 12 can be produced using the monocrystal production method disclosed in Japanese Patent No. 4569872 or Japanese Unexamined Patent Application Publication No. 2006-327837A, for example. The monocrystalline $CaF_2$ ingot obtained using this production method can then be machined to form each of the hollow cylinder-shaped transparent member 10, the disk-shaped cap 11, and the circular ring-shaped flange 12.

Next, the optical polishing process is applied to the outer surface 10o and the inner surface 10i of the transparent member 10. Any conventional polishing method suitable for use with optical components can be used as-is for the optical polishing process of the present embodiment. For example, the transparent member 10 machined from the monocrystalline $CaF_2$ may be polished using a polishing pad or polishing sand.

Next, a mirror polishing process is applied to the top surface 10a and the bottom surface 10b of the transparent member 10 (see FIG. 1C), the bottom surface 11b of the cap 11, and the top surface 12a of the flange 12. This mirror polishing process is applied to increase the pressure-bonding strength between the transparent member 10 and the cap 11 as well as the pressure-bonding strength between the transparent member 10 and the flange 12 during the pressure-bonding process (described later). Any conventional polishing method suitable for use with optical components can be used as-is for the mirror polishing process. For example, a polishing process using an Oscar-type polishing device may be used. It is preferable that the center line average surface roughness Ra of each surface after the mirror polishing process be less than or equal to 20 nm and more preferable that the center line average surface roughness Ra be less than or equal to 5 nm. Here, the center line average roughness Ra can be measured according to the JISB0601 standard.

Figure 3:
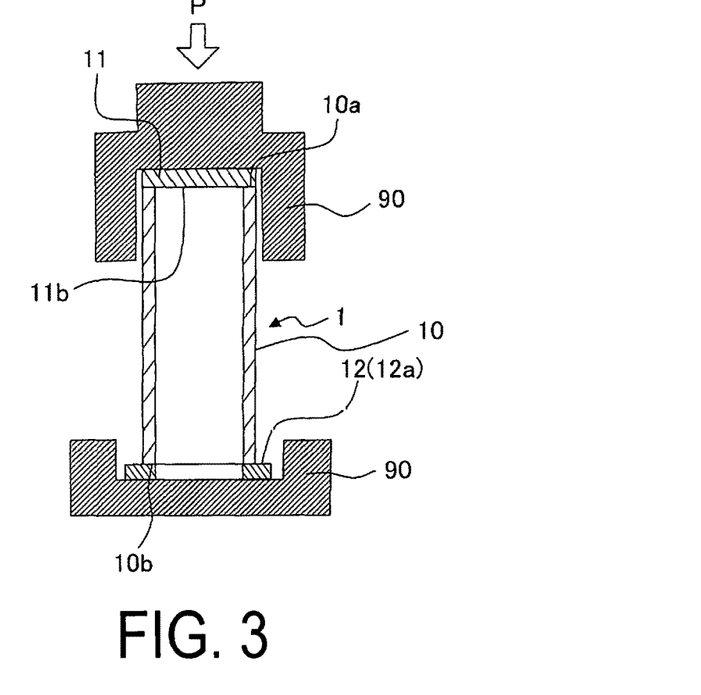
FIG. 3 illustrates how components of the optical member according to the embodiment of the present disclosure are fixed together using jigs.

Next, the transparent member 10, the cap 11, and the flange 12 prepared as described above are pressure-bonded together. First, as illustrated in FIG. 3, the bottom surface 11b of the cap 11 is brought into contact with the top surface 10a of the transparent member 10, the bottom surface 10b of the transparent member 10 is brought into contact with the top surface 12a of the flange 12, and the transparent member 10, the cap 11, and the flange 12 are adjusted so as to be arranged coaxially with one another. The transparent member 10, the cap 11, and the flange 12 are then fixed in this state using jigs 90. Here, the jig 90 is made from carbon, for example.

Next, the transparent member 10, the cap 11, and the flange 12 (which are fixed together by the jigs 90) are placed in a furnace. The inside of the furnace is filled with an inert gas such as $N_2$ or Ar to create an inert gas atmosphere or evacuated to create a vacuum atmosphere. The furnace may be an electric furnace, a gas furnace, or the like.

Inside the furnace, pressure is applied to the upper jig 90 from above (or to both the upper and lower jigs 90 from both above and below) such that the contact surface between the transparent member 10 and the cap 11 and the contact surface between the transparent member 10 and the flange 12 experience a prescribed pressure P (see FIG. 3) from a direction orthogonal to these contact surfaces. It is preferable that this pressure P be 2.1 to 5.8 MPa and more preferable that this pressure P be 2.1 to 3.6 MPa. It is preferable that the atmospheric pressure inside the furnace be lower than or equal to 0.1 MPa and more preferable that the atmospheric pressure inside the furnace be lower than or equal to 0.0001 MPa.

Then, the temperature inside the furnace is increased to a prescribed temperature over the course of 6 hours, and this prescribed temperature is maintained for approximately 1 to 30 minutes. Let this prescribed temperature be the target temperature T, It is preferable that the target temperature T be 400 to 1100° C., more preferable that the target temperature T be 400 to 800° C., and still more preferable that the target temperature T be 400 to 500° C. Next, the temperature inside the furnace is decreased over the course of 12 hours, and after this cooling period, the pressure is removed from the jigs 90. The process described above produces the optical member 1, in which the transparent member 10, the cap 11, and the flange 12 are pressure-bonded together into a single component. It should also be noted that the target temperature T may be maintained for longer than 30 minutes.

Here, a plurality of monocrystalline $CaF_2$ test specimens were pressure-bonded together using different pressures P and target temperatures T in order to investigate how changing the pressure P and the target temperature T affects the resulting pressure bond.

The test specimens X and Y used for this pressure-bonding test were disk-shaped members with 30 mm in diameter and 10 mm in thickness. The planar (circular) surfaces of the test specimens X and Y were both mirror polished to a surface roughness Ra of less than or equal to 5 nm. The test specimens X and Y were then fixed together with these polished surfaces in contact with one another using carbon jigs and placed in a furnace. The atmosphere inside the furnace was a nitrogen atmosphere with a pressure of 0.01 MPa.

Next, a pressure P was applied to the contact surface between the test specimens X and Y from a direction orthogonal to the contact surface via the carbon jigs. The temperature inside the furnace was increased to the target temperature T over the course of 1 hour and maintained at that target temperature T for 30 minutes. Then, the temperature inside the furnace was decreased over the course of 12 hours, and after this cooling period, the pressure was removed from the carbon jigs.

Figure 4:
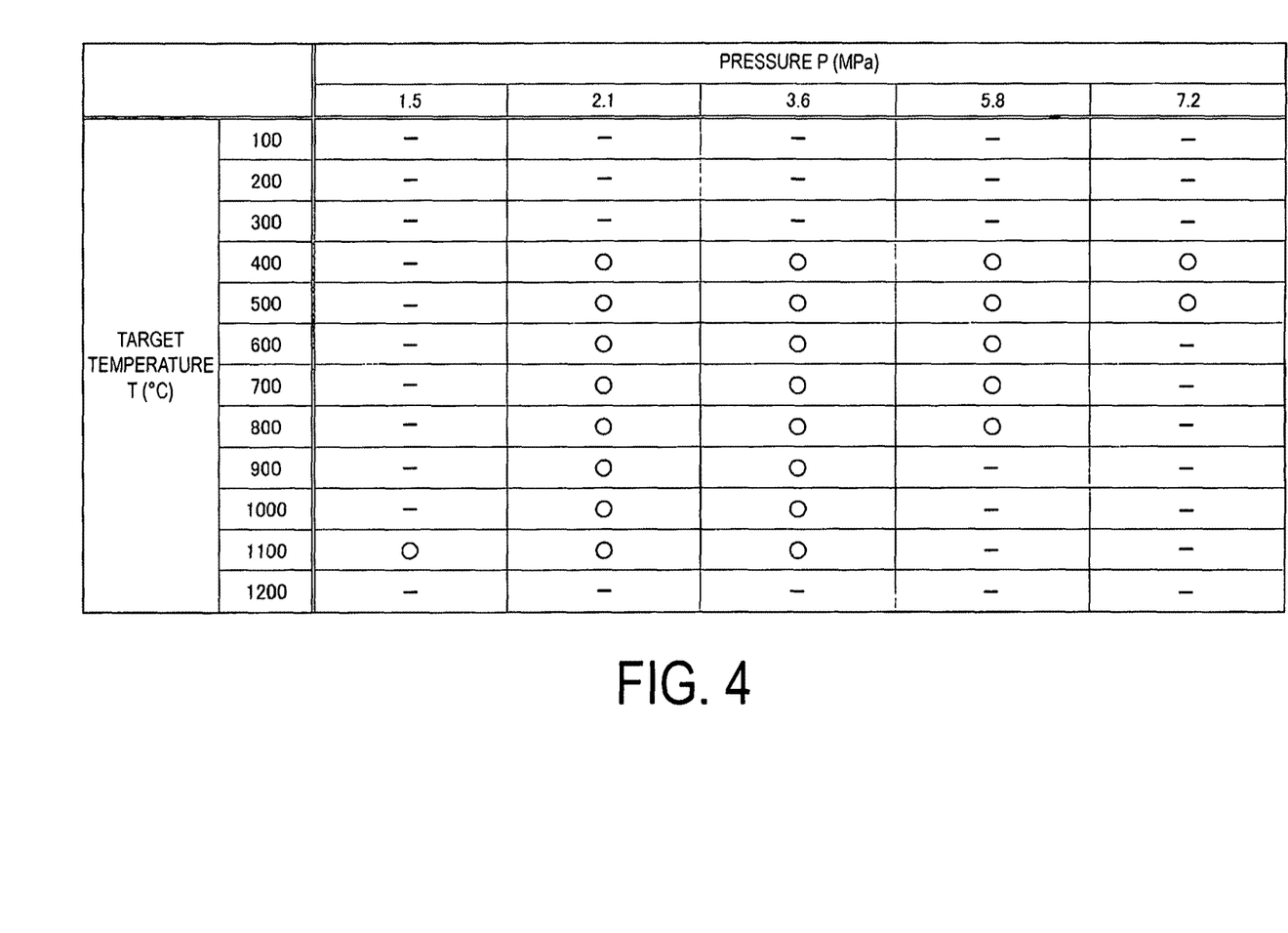
FIG. 4 is a table showing the observation results of a pressure-bonding test performed on test specimens using various different pressures and target temperatures during the pressure-bonding process.

Next, the test specimens X and Y were removed from the furnace to determine if a pressure bond had been successfully formed. The value used for the target temperature T was increased from 100° C. to 1200° C. in 100° C. increments, and five values ranging from 1.5 to 7.2 MPa were used for the pressure P. FIG. 4 shows whether a pressure bond was formed for each combination of the target temperature T and the pressure P. To determine whether a pressure bond had formed, the test specimen X was lifted up. If the test specimen Y did not separate and fall from the test specimen X under its own weight, it was determined that a pressure bond had been successfully formed ("○" in FIG. 4), and if the test specimen Y did separate and fall from the test specimen X under its own weight, it was determined that a pressure bond had not been successfully formed ("-" in FIG. 4).

Next, the results of this pressure-bonding test will be described in more detail with reference to FIG. 4.

<Pressure P=1.5 MPa>

When the pressure P was set to 1.5 MPa in the pressure-bonding test, a pressure bond was only successfully formed when the target temperature T was set to 1100° C. For all other values of the target temperature T, a pressure bond was not successfully formed.

<Pressure P=2.1 MPa>

When the pressure P was set to 2.1 MPa, a pressure bond was successfully formed when the target temperature T was set to values in the range of 400 to 1100° C. A pressure bond was not successfully formed for values of the target temperature T in the range of 100 to 300° C. and 1200° C.

<Pressure P=3.6 MPa>

When the pressure P was set to 3.6 MPa, a pressure bond was successfully formed when the target temperature T was set to values in the range of 400 to 1100° C. A pressure bond was not successfully formed for values of the target temperature T in the range of 100 to 300° C. and 1200° C.

<Pressure P=5.8 MPa>

When the pressure P was set to 5.8 MPa, a pressure bond was successfully formed when the target temperature T was set to values in the range of 400 to 800° C. A pressure bond was not successfully formed for values of the target temperature T in the ranges of 100 to 300° C. and 900 to 1200° C.

<Pressure P=7.2 MPa>

When the pressure P was set to 7.2 MPa, a pressure bond was only successfully formed when the target temperature T was set to 400° C. or 500° C. A pressure bond was not successfully formed for values of the target temperature T in the ranges of 100 to 300° C. and 600 to 1200° C.

These results indicate that in the monocrystalline $CaF_2$ pressure-bonding process, setting the pressure P to 2.1 to 5.8 MPa makes it possible to successfully form a pressure bond across a wide range of target temperatures T, and setting the pressure P to 2.1 to 3.6 MPa makes it possible to successfully form a pressure bond across an even wider range of target temperatures T. Therefore, it is preferable that the pressure P used in the pressure-bonding process be set 2.1 to 5.8 MPa and more preferable that this pressure P be set to 2.1 to 3.6 MPa.

These results also indicate that in the monocrystalline $CaF_2$ pressure-bonding process, setting the target temperature T to 400 to 1100° C. makes it possible to successfully form a pressure bond across a wide range of pressures P, and setting the target temperature T to 400 to 800° C. makes it possible to successfully form a pressure bond across an even wider range of pressures P. Moreover, setting the target temperature T to 400 to 500° C. makes it possible to successfully form a pressure bond across the still wider range of pressures P. Therefore, it is preferable that the target temperature T used in the pressure-bonding process be set to 400 to 1100° C., more preferable that the target temperature T be set to 400 to 800° C., and still more preferable that the target temperature T be set to 400 to 500° C. Furthermore, in terms of combinations of the pressure P and the target temperature T, it is preferable that the pressure P be set to 2.1 to 5.8 MPa and the target temperature T be set to 400 to 1100° C., and it is more preferable that the pressure P be set to 2.1 to 5.8 MPa and the target temperature T be set to 400 to 800° C.

The method of producing the optical member 1 according to the present embodiment makes it possible to produce monocrystalline $CaF_2$ members of a variety of shapes simply by making a plurality of monocrystalline $CaF_2$ members having relatively basic shapes and then pressure-bonding these basic shapes together. Moreover, the method of producing the optical member 1 according to the present embodiment using this pressure-bonding process makes it possible to easily produce monocrystalline $CaF_2$ (which is difficult to machine) optical members of a variety of shapes without having to rely entirely on machining processes.

In the embodiment as described above, the transparent member 10, the cap 11, and the flange 12 are all made from monocrystalline $CaF_2$. However, the cap 11 and the flange 12 (but not the transparent member 10) may instead be made from polycrystalline $CaF_2$. Even when the cap 11 and the flange 12 are made from polycrystalline $CaF_2$, the same mirror polishing process as in the embodiment described above can still be applied to the top and bottom surfaces 10a and 10b of the transparent member 10, the bottom surface 11b of the cap 11, and the top surface 12a of the flange 12. Moreover, the same pressure-bonding process using the same pressure P and target temperature T conditions and the like as in the embodiment described above can still be applied to pressure-bond the cap 11 to the transparent member 10 and the transparent member 10 to the flange 12. When the cap 11 and the flange 12 are to be made from polycrystalline $CaF_2$, the method disclosed in WO/2012/165334, for example, can be used to produce these members. This configuration makes it possible to reduce the amount of expensive monocrystalline $CaF_2$ used in the optical member 1, thereby making it possible to reduce the overall production costs of the optical member 1. Moreover, polycrystalline $CaF_2$ does not have the cleavage planes characteristic of monocrystalline $CaF_2$ and therefore exhibits excellent machinability in comparison with monocrystalline $CaF_2$.

Furthermore, in the embodiment described above, the transparent member 10 and the cap 11 are separate components. However, the transparent member 10 and the cap 11 may also be formed as a single integrated component by machining a monocrystalline $CaF_2$ ingot as appropriate. In this case, the optical member 1 can be produced simply by pressure-bonding the flange 12 to this machined component. Here, the flange 12 may be made from either monocrystalline $CaF_2$ or polycrystalline $CaF_2$. Forming the transparent member 10 and the cap 11 as a single component in this way makes it possible to increase the strength of the optical member 1 to internal pressure.

Figure 5:
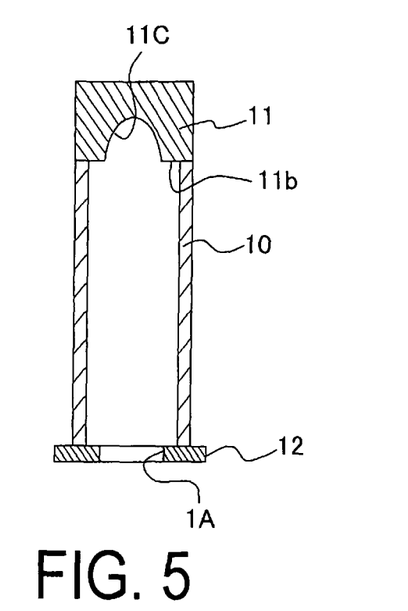
FIG. 5 is a cross-sectional view of an optical member according to a modification example of the present disclosure taken along an axial direction.

In the embodiment described above, the bottom surface 11b of the cap 11 is planar. However, as illustrated in FIG. 5, a recess 11C may be formed in the center of the bottom surface 11b of the cap 11 in the radial direction thereof. When the cap 11 is made from monocrystalline $CaF_2$, this recess 11C can be formed using a machining process. Moreover, the thickness of the cap 11 may be increased according to the depth of the recess 11C. Forming this recess 11C makes it possible to control the flow of the gas that emits plasma light and also makes it possible to make the recess 11C function as an optical lens as necessary.

Furthermore, in the embodiment described above, the temperature inside the furnace starts to be increased to the target temperature T after application of the pressure P has been started. However, the present disclosure is not limited to this example, and the application of the pressure P may be started when the temperature inside the furnace is increasing to the target temperature T or after the temperature inside the furnace has already reached the target temperature T. Moreover, in the embodiment described above, the inner diameter of the flange 12 and the inner diameter of the transparent member 10 are equal. However, as illustrated in FIG. 5, the inner diameter of the flange 12 may instead be smaller than the inner diameter of the transparent member 10.

Modification Example 1-1

Figure 6:
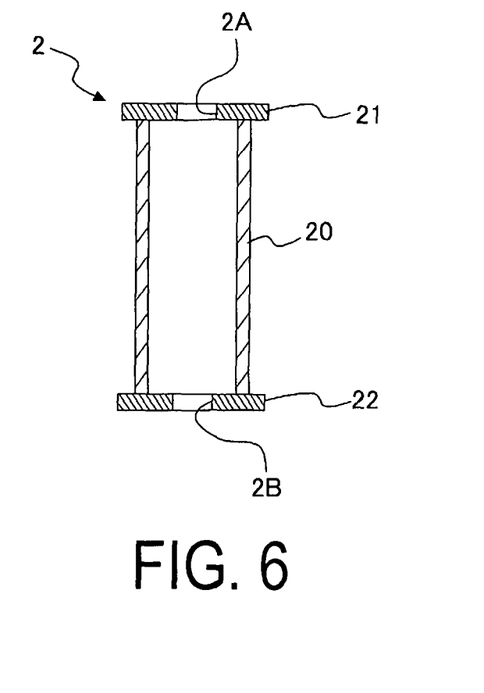
FIG. 6 is a cross-sectional view of an optical member according to a modification example of the present disclosure taken along an axial direction.

FIG. 6 is a cross-sectional view of an optical member 2 according to Modification Example 1-1 of Embodiment 1. The optical member 2 includes a hollow cylinder-shaped transparent member 20 and circular ring-shaped first and second flanges 21 and 22 that are respectively pressure-bonded to the ends of the transparent member 20. The optical member 2 is filled with a gas, and then an opening 2A in the first flange 21 and an opening 2B in the second flange 22 are sealed with caps (not illustrated) in order to seal the gas within the optical member 2. The first flange 21 and the second flange 22 can then be supported using any kind of supporting member (not illustrated), thereby allowing the optical member 2 to be used as the light source in an exposure device, a wafer inspection device, or the like. The optical member 2 includes flanges formed on both ends of the optical member 20, thereby making it possible to fix the optical member 2 in place on both the upper and lower sides thereof using the first flange 21 and the second flange 22 arranged on the ends of the transparent member 20. This configuration makes it possible to input a gas through one of the openings 2A and 2B and exhaust the gas through the other of the openings.

The transparent member 20 is made from monocrystalline $CaF_2$ and can be formed using the same machining process used to form the transparent member 10. The first flange 21 and the second flange 22 may be made from either monocrystalline $CaF_2$ or polycrystalline $CaF_2$. If monocrystalline $CaF_2$ is used, the first flange 21 and the second flange 22 can be formed using the same machining process used to form the flange 12 or the like. If polycrystalline $CaF_2$ is used, the first flange 21 and the second flange 22 can be formed using the method disclosed in WO/2012/165334, for example. The first flange 21 and the second flange 22 are pressure-bonded to the transparent member 20 following the same procedure as in the embodiment described above, which includes applying the same mirror polishing process using the same conditions as in the embodiment described above and using the same pressure P and target temperature T conditions and the like as in the embodiment described above for the pressure-bonding process itself.

Embodiment 2

Figure 7A:
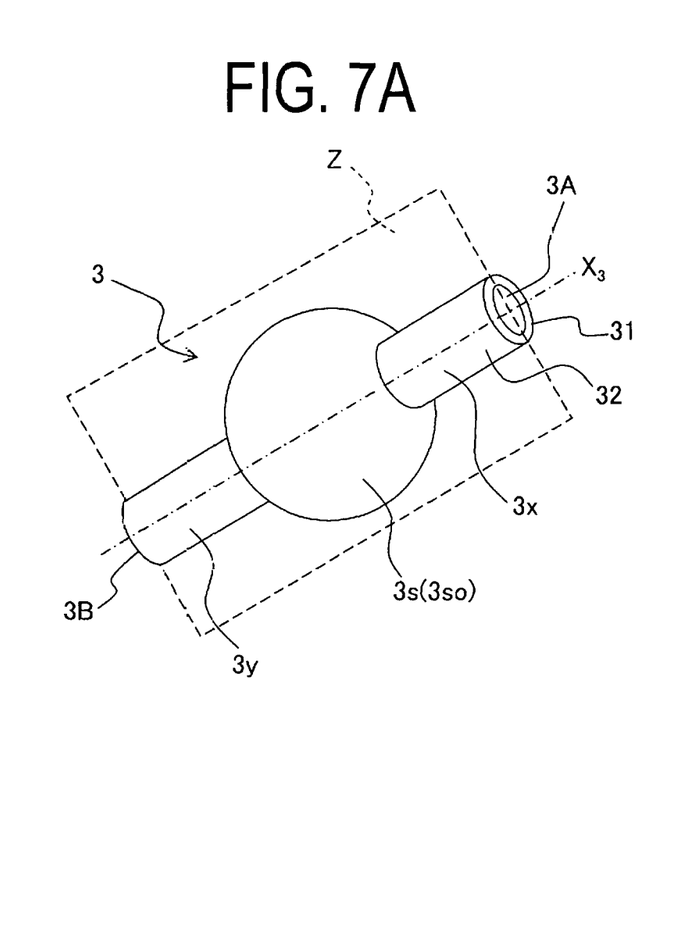
FIG. 7A is a perspective view.

Next, Embodiment 2 of the present disclosure will be described with reference to FIG. 7.

An optical member 3 according to the present embodiment is a $CaF_2$ tube that contains a gas therein and emits plasma light when this gas reaches a plasma state. The optical member 3 includes a first cylindrical tube 3x, a second cylindrical tube 3y, and a spherical shell 3s. The first cylindrical tube 3x and the second cylindrical tube 3y are arranged coaxially along the same center axis $X_3$. The spherical shell 3s is sandwiched between the first cylindrical tube 3x and the second cylindrical tube 3y in the axis $X_3$ direction such that the center of the spherical shell 3s lies on the axis $X_3$. The optical member 3 is made from monocrystalline $CaF_2$.

The first cylindrical tube 3x and the second cylindrical tube 3y are hollow cylinders, and the spherical shell 3s is a hollow sphere (spherical shell). In the present specification, the terms "sphere" and "spherical shell" refer not only to perfect spheres and perfect spherical shell shapes but also to rotationally symmetric shapes with elliptical cross sections, perfect spheres/perfect spherical shells/rotationally symmetric shapes with elliptical cross sections in which a portion of the shape is cut out, and substantially spherical and substantially spherical shell shapes in which the distance from the center to a portion in the outer surface is different from the distance from the center to an area around the said portion in the outer surface and/or the distance from the center to a portion in the inner surface are different from the distance from the center to an area around the said portion in the inner surface.

The first cylindrical tube 3x and the second cylindrical tube 3y have the same inner diameters and outer diameters. The inner diameter of the spherical shell 3s is greater than the inner diameters of the first cylindrical tube 3x and the second cylindrical tube 3y, and the outer diameter of the spherical shell 3s is greater than the outer diameters of the first cylindrical tube 3x and the second cylindrical tube 3y. Moreover, an optical polishing process is applied to an outer surface 3so and an inner surface 3si (see FIG. 7B) of the spherical shell 3s.

The optical member 3 can be used in a variety of fields. In the semiconductor manufacturing equipment industry, for example, the optical member 3 can be used in the light source for an exposure device or in the light source for a wafer inspection device or the like. In this case, the optical member 3 is filled with a gas via at least one of the openings 3A and 3B formed at either end thereof, and the openings 3A and 3B are then sealed with caps (not illustrated) in order to seal the gas inside the optical member 3. The optical member 3 in which the gas is sealed therein is then fixed in place using any type of support member. The gas sealed inside the optical member 3 is then irradiated with excitation light to excite the gas atoms (or gas molecules) to a plasma state. The resulting plasma light can then be emitted to outside of the optical member 3 through the spherical shell 3s.

The optical member 3 according to the present embodiment includes the hollow sphere-shaped spherical shell 3s. Therefore, sealing the gas inside the spherical shell 3s to create point light source of plasma makes it possible for the light emitted in a radial pattern from the point light source to be efficiently emitted to outside of the optical member 3.

Next, a method of producing the optical member 3 according to the present embodiment will be described.

The optical member 3 can be produced by pressure-bonding together a first member 31 that has a shape formed by splitting the optical member 3 into two portions along a plane that includes the center axis $X_3$ of the first cylindrical tube 3x and the second cylindrical tube 3y and a second member 32 that has the same shape as the first member 31. The plane Z illustrated in FIG. 7A is one example of such a splitting plane. FIG. 7B illustrates the shape of the first member 31 and the second member 32 as viewed from the plane Z (that is, a cross section of the optical member 3 taken along the plane Z).

The first member 31 and the second member 32 can be produced by machining a monocrystalline $CaF_2$ ingot. After the machining process, an optical polishing process is applied to the portions of the first member 31 and the second member 32 corresponding to the outer surface 3so and the inner surface 3si of the spherical shell 3s. At this time, the inner surface 3si of the spherical shell 3s is split half and half between the first member 31 and the second member 32, thereby making it easier to apply external processes. Therefore, any conventional polishing method suitable for use with optical components can be used as-is, thereby making it possible to easily apply the optical polishing process to the inner surface 3si.

Figure 7B:
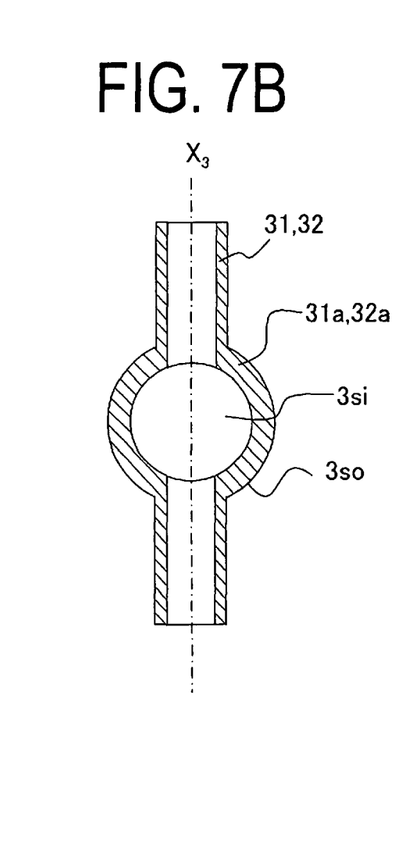
FIG. 7B is a cross-sectional view taken along a plane Z in FIG. 7A.

Next, a mirror polishing process is applied to a pressure-bonding surface 31a of the first member 31 and a pressure-bonding surface 32a of the second member 32, which are illustrated in FIG. 7B. This mirror polishing process is applied in order to increase the pressure-bonding strength between the first member 31 and the second member 32 in the pressure-bonding process (described later). Any conventional polishing method suitable for use with optical components can be used as-is for this mirror polishing process. It is preferable that the center line average surface roughness Ra (which can be measured according to the JISB0601 standard) of the pressure-bonding surface 31a and the pressure-bonding surface 32a after the mirror polishing process be less than or equal to 20 nm and more preferable that the center line average surface roughness Ra of these surfaces be less than or equal to 5 nm.

Next, the first member 31 and the second member 32 are arranged with the pressure-bonding surface 31a and the pressure-bonding surface 32a lined up in contact with one another and fixed in place using a jig (not illustrated). The first member 31 and the second member 32 that are fixed together by the jig are then placed in a furnace, where the first member 31 and the second member 32 are pressure-bonded together using the same pressure-bonding process as in Embodiment 1 (that is, using the same pressure P and target temperature T conditions and the like as in Embodiment 1). In this way, the first member 31 and the second member 32 are pressure-bonded together into a single component to form the optical member 3.

The producing method according to the present embodiment makes it possible to easily produce monocrystalline $CaF_2$ optical members having a spherical shell shape, which are difficult to produce using conventional machining processes. Moreover, in the producing method according to the present embodiment, the spherical shell 3s is formed by first forming the first member 31 and the second member 32 separately and then pressure-bonding the first member 31 and the second member 32 together to form the spherical shell 3s. This producing method makes it possible to easily and effectively apply the optical polishing process to the inner surface 3si of the spherical shell 3s prior to the pressure-bonding process.

Embodiment 3

Figure 8A:
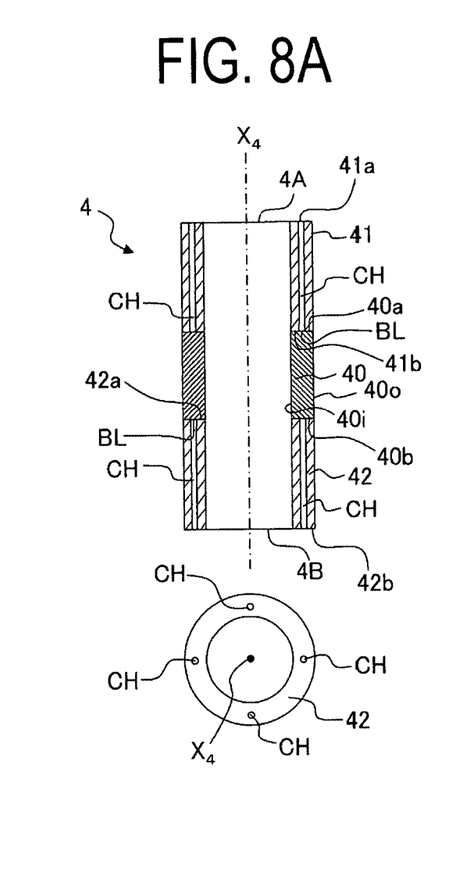
FIG. 8A is a cross-sectional view of an optical member according to another embodiment of the present disclosure taken along an axial direction.

Next, Embodiment 3 of the present disclosure will be described with reference to FIGS. 8A and 8B.

An optical member 4 according to the present embodiment is a $CaF_2$ tube that contains a gas therein and emits plasma light when this gas reaches a plasma state. As illustrated in FIG. 8A, the optical member 4 includes a transparent member 40 and a first cooling member 41 and a second cooling member 42 that are pressure-bonded to the transparent member 40. The transparent member 40, the first cooling member 41, and the second cooling member 42 are all hollow cylinder-shaped and are arranged coaxially along the same center axis $X_4$. The first cooling member 41 is arranged on one end side of the transparent member 40 in the center axis $X_4$ direction, and the second cooling member 42 is arranged on the other end side of the transparent member 40. The transparent member 40, the first cooling member 41, and the second cooling member 42 are all made from monocrystalline $CaF_2$. Moreover, the transparent member 40, the first cooling member 41, and the second cooling member 42 all have the same inner diameter and outer diameter, and therefore the inner surfaces and outer surfaces of these components are smoothly connected in the axis $X_4$ direction. An optical polishing process is applied to both an outer surface 40o and an inner surface 40i of the transparent member 40.

The first cooling member 41 includes four flow paths CH that run in the axial direction. These four flow paths CH are arranged separate from one another at equal intervals in the circumferential direction of the hollow cylinder-shaped first cooling member 41. Moreover, each of the four flow paths CH forms an opening in a top surface 41*a* and a bottom surface 41*b* of the first cooling member 41. However, the bottom surface 41*b* of the first cooling member 41 is pressure-bonded to a top surface 40*a* of the transparent member 40, and therefore the openings formed in the bottom surface 41*b* of the first cooling member 41 are sealed by the top surface 40*a* of the transparent member 40. In this way, sealed locations BL are formed at the positions where the flow paths CH are sealed by the transparent member 40. Like the first cooling member 41, the second cooling member 42 includes four flow paths CH that run in the axial direction and are arranged separate from one another at equal intervals in the circumferential direction of the hollow cylinder-shaped second cooling member 42. Moreover, each of the four flow paths CH forms an opening in a top surface 42*a* and a bottom surface 42*b* of the second cooling member 42. However, the top surface 42*a* of the second cooling member 42 is pressure-bonded to a bottom surface 40*b* of the transparent member 40, and therefore the openings formed in the top surface 42*a* of the second cooling member 42 are sealed by the bottom surface 40*b* of the transparent member 40 at the sealed locations BL.

The optical member 4 can be used in a variety of fields. In the semiconductor manufacturing equipment industry, for example, the optical member 4 can be used in the light source for an exposure device or in the light source for a wafer inspection device or the like. When the optical member 4 is used as a light source for a wafer inspection device, the optical member 4 is supported by a metal support member (not illustrated). Then, the optical member 4 is filled with a gas via at least one of the openings 4A and 4B formed at either end thereof in the axial direction, and the openings 4A and 4B are sealed with caps (not illustrated) in order to seal the gas inside the optical member 4. The sealed gas is then irradiated with excitation light until the gas reaches a plasma state. The resulting plasma light emitted from the plasma-state gas can then be emitted to outside of the optical member 4 via the transparent member 40.

Furthermore, when the optical member 4 according to the present embodiment is in use, a coolant such as water or air is circulated through the flow paths CH of the optical member 4 using any type of fluid supply mechanism (not illustrated). The coolant in the flow paths CH contacts the transparent member 40 at the sealed locations BL, thereby cooling the transparent member 40. This configuration makes it possible to inhibit increases in the temperature of the transparent member 40 due to heat received from the plasma and the plasma light.

The configuration of the optical member 4 described above makes it possible to inhibit increases in the temperature of the transparent member 40 by circulating a coolant through the flow paths CH. Therefore, the optical member 4 of the present embodiment makes it possible to prevent changes in the physical structure or physical properties of the transparent member 40 due to an increase in temperature, thereby making it possible to maintain good emission of light from the optical member 4. Moreover, the optical member 4 according to the present embodiment makes it possible to prevent stress caused by thermal expansion when the optical member 4 is in use as well as any associated damage such as cracking that might otherwise occur.

Next, a method of producing the optical member 4 according to the present embodiment will be described.

The monocrystalline $CaF_2$ material used for the transparent member 40, the first cooling member 41, and the second cooling member 42 can be produced using the monocrystal production method disclosed in Japanese Patent No. 4569872 or Japanese Unexamined Patent Application Publication No. 2006-327837A, for example. The monocrystalline $CaF_2$ ingot obtained using this production method can then be machined to form each of the hollow cylinder-shaped transparent member 40, the first cooling member 41, and the second cooling member 42. Then, the first cooling member 41 and the second cooling member 42 are machined to form the flow paths CH therein.

Next, the optical polishing process is applied to the outer surface 40*o* and the inner surface 40*i* of the transparent member 40. Any conventional polishing method suitable for use with optical components can be used as-is for the optical polishing process of the present embodiment.

Next, a mirror polishing process is applied to the top surface 40*a* and the bottom surface 40*b* of the transparent member 40, the bottom surface 41*b* of the first cooling member 41, and the top surface 42*a* of the second cooling member 42. This mirror polishing process is applied in order to increase the pressure-bonding strength between the transparent member 40 and the first cooling member 41 as well as the pressure-bonding strength between the transparent member 40 and the second cooling member 42 in the pressure-bonding process (described later). Any conventional polishing method suitable for use with optical components can be used as-is for this mirror polishing process. It is preferable that the center line average surface roughness Ra (which can be measured according to the JISB0601 standard) of each surface after the mirror polishing process be less than or equal to 20 nm and more preferable that the center line average surface roughness Ra of each surface be less than or equal to 5 nm.

Next, the transparent member 40, the first cooling member 41, and the second cooling member 42 prepared as described above are pressure-bonded together. First, the bottom surface 41*b* of the first cooling member 41 is brought into contact with the top surface 40*a* of the transparent member 40, the bottom surface 40*b* of the transparent member 40 is brought into contact with the top surface 42*a* of the second cooling member 42, and the transparent member 40, the first cooling member 41, and the second cooling member 42 are adjusted so as to be arranged coaxially with one another. The transparent member 40, the first cooling member 41, and the second cooling member 42 are then fixed in this state using jigs (not illustrated).

Then, the transparent member 40, the first cooling member 41, and the second cooling member 42 that are fixed together by the jigs are placed in a furnace, where the transparent member 40 is pressure-bonded to the first cooling member 41 and the second cooling member 42 using the same pressure-bonding process as in Embodiment 1 (that is, using the same pressure P and target temperature T conditions and the like as in Embodiment 1). The process described above produces the optical member 4, in which the transparent member 40, the first cooling member 41, and the second cooling member 42 are pressure-bonded together into a single component.

The method of producing the optical member 4 according to the present embodiment makes it possible to produce monocrystalline $CaF_2$ members having a built-in cooling structure simply by making a plurality of monocrystalline $CaF_2$ members having relatively basic shapes and then pressure-bonding these basic shapes together. Therefore, the method of producing the optical member 4 according to the present embodiment makes it possible to easily produce optical members that have a built-in cooling structure and are made from monocrystalline CaF$_2$ (which is difficult to machine) without having to rely entirely on machining processes.

In the embodiment described above, the first cooling member 41 and the second cooling member 42 each have four flow paths CH. However, the number of flow paths formed in the first cooling member 41 and the second cooling member 42 is not particularly limited and may be greater than or less than four. Moreover, in the embodiment described above, the flow paths CH formed in the first cooling member 41 and the second cooling member 42 are separated from one another at equal intervals in the circumferential direction. However, the present invention is not limited to this configuration, and the flow paths CH may instead be arranged at non-uniform intervals in the circumferential direction.

Furthermore, in the embodiment as described above, the first cooling member 41 and the second cooling member 42 are both made from monocrystalline CaF$_2$. However, the first cooling member 41 and the second cooling member 42 may instead be made from polycrystalline CaF$_2$. Even when the first cooling member 41 and the second cooling member 42 are made from polycrystalline CaF$_2$, the same mirror polishing process using the same conditions as in the embodiment described above can still be applied, and the same pressure-bonding process using the same pressure P and target temperature T conditions and the like as in the embodiment described above can still be applied to pressure-bond the transparent member 40 to the first cooling member 41 and the second cooling member 42. This configuration makes it possible to reduce the amount of expensive monocrystalline CaF$_2$ used in the optical member 4, thereby making it possible to reduce the overall production costs of the optical member 4. Moreover, polycrystalline CaF$_2$ has excellent machinability and therefore makes it possible to easily utilize complex machining processes.

Modification Example 3-1

Figure 8B:
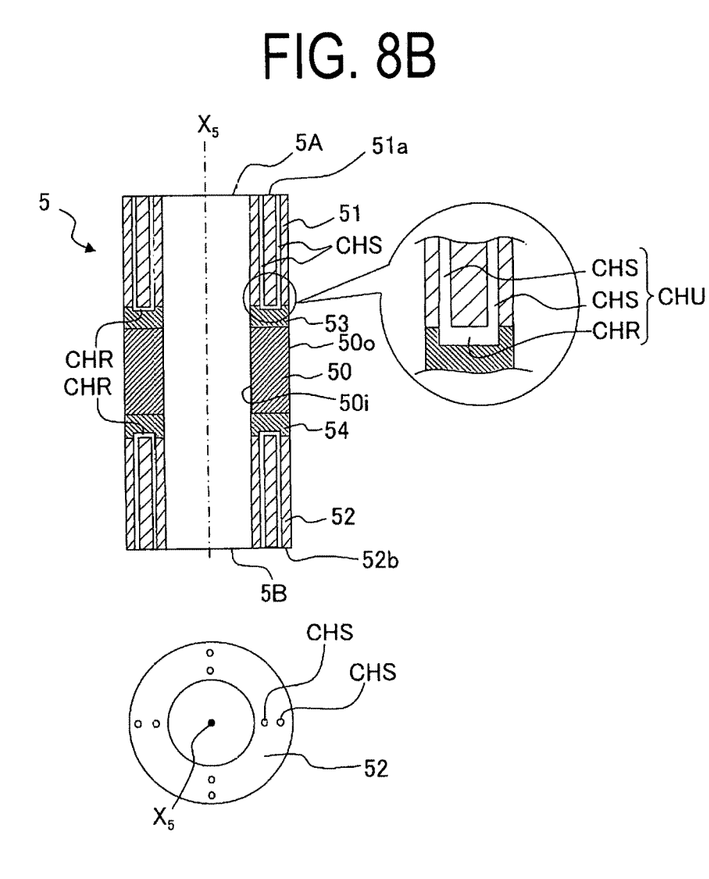
FIG. 8B is a cross-sectional view of an optical member according to a modification example of the present disclosure taken along an axial direction.

FIG. 8B illustrates an optical member 5 according to Modification Example 3-1 of Embodiment 3. The optical member 5 includes a transparent member 50, a first cooling member 51, a second cooling member 52, a third cooling member 53, and a fourth cooling member 54. In the optical member 5 according to Modification Example 3-1, similar to the first cooling member 41 and the second cooling member 42 of the optical member 4, the first cooling member 51 and the second cooling member 52 each include four straight flow paths CHS that run in an axis X$_5$ direction of the optical member 5 and are arranged separate from one another at equal intervals in the circumferential direction. However, unlike the first cooling member 41 and the second cooling member 42, the first cooling member 51 and the second cooling member 52 also each include four additional straight flow paths CHS that are respectively aligned with the abovementioned four straight flow paths CHS in the radial direction.

Moreover, unlike the optical member 4, the optical member 5 according to Modification Example 3-1 further includes the third cooling member 53 that is arranged between the transparent member 50 and the first cooling member 51 and has four return flow paths CHR that run in the radial direction as well as the fourth cooling member 54 that is arranged between the transparent member 50 and the second cooling member 52 and similarly has four return flow paths CHR that run in the radial direction.

In the optical member 5 according to Modification Example 3-1, each set of the two straight flow paths CHS that are aligned in the radial direction of the first cooling member 51 and the respective return flow path CHR formed in the third cooling member forms a substantially U-shaped flow path CHU that has two openings in a top surface 51a of the first cooling member 51. In other words, the first cooling member 51 and the third cooling member 53 form four U-shaped flow paths CHU. Similarly, the second cooling member 52 and the fourth cooling member 54 form four substantially U-shaped flow paths CHU that each have two openings in a bottom surface 52b of the second cooling member 52.

The optical member 5 can be used in the same way as the optical member 4. In other words, a coolant such as water or air can be circulated through the flow paths CHU using any type of fluid control mechanism (not illustrated in the figure) in order to inhibit increases in the temperature of the transparent member 50 due to heat received from plasma and plasma light.

The optical member 5 can also be produced in the same way as the optical member 4. More specifically, first a monocrystalline CaF$_2$ ingot is machined to form the transparent member 50 (in which an optical polishing process is applied to an outer surface 50o and an inner surface 50i thereof), the first cooling member 51 and the second cooling member 52 that have the straight flow paths CHS, and the third cooling member 53 and the fourth cooling member 54 that have the return flow paths CHR. Then, the same mirror polishing process and pressure-bonding process as in Embodiment 3 are used to pressure-bond the transparent member 50, the first cooling member 51, the second cooling member 52, the third cooling member 53, and the fourth cooling member 54 together into a single hollow cylinder-shaped component that has two openings 5A and 5B. In the producing method according to Modification Example 3-1, the U-shaped flow paths CHU are formed by pressure-bonding two members together. Therefore, Modification Example 3-1 makes it possible to form the U-shaped flow paths CHU simply by forming the straight-line shaped straight flow paths CHS in the first cooling member 51 and the second cooling member 52 and forming the straight-line shaped return flow paths CHR in the third cooling member 53 and the fourth cooling member 54 (that is, simply by machining straight line-shaped paths in the monocrystalline CaF$_2$ ingot).

Figure 9A:
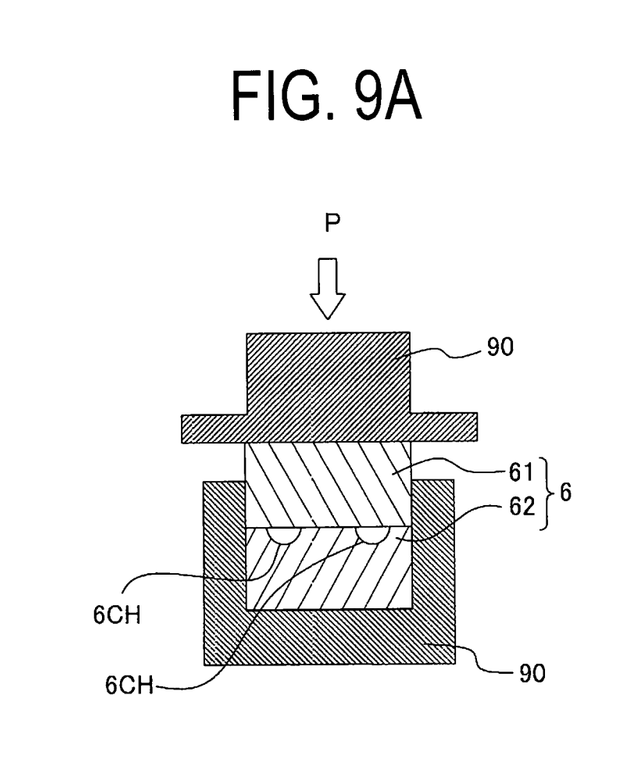
FIG. 9A illustrates a method of producing a microchip using a pressure-bonding process of the present disclosure.

In the embodiments described above, the optical member is a CaF$_2$ tube that contains a gas therein. However, the present disclosure is not limited to this example. As an example of another type of optical member, the pressure-bonding process described above can be used to produce a microchip 6. As illustrated in FIG. 9A, an upper portion 61 and a lower portion 62 in which flow paths 6CH are formed are fixed together using jigs 90. Then, the same pressure-bonding process using the same pressure P and target temperature T conditions and the like as in the embodiments described above can be applied to pressure-bond the upper portion 61 and the lower portion 62 together into a single microchip 6.

Figure 9B:
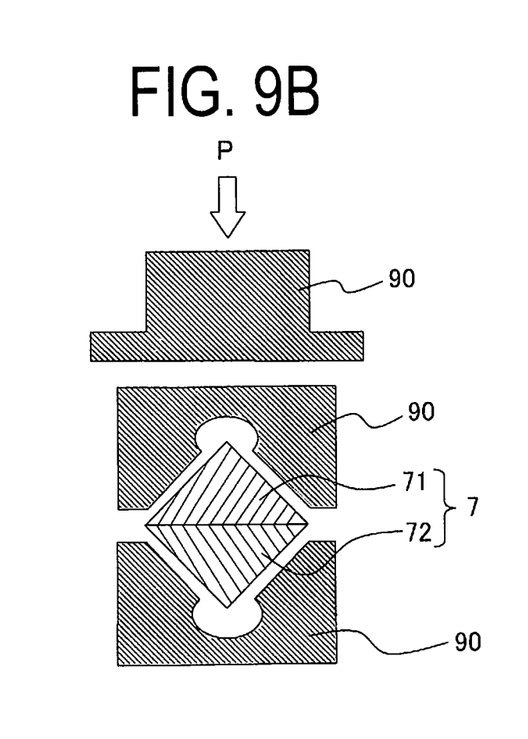
FIG. 9B illustrates a method of producing a prism using the pressure-bonding process of the present disclosure.

As another example of another type of optical member, the pressure-bonding process described above can be used to produce a prism 7. As illustrated in FIG. 9B, an upper portion 71 and a lower portion 72 are fixed together using jigs 90. Then, the same pressure-bonding process using the same pressure P and target temperature T conditions and the like as in the embodiments described above can be applied to pressure-bond the upper portion 71 and the lower portion 72 together into a single prism 7. This pressure-bonding process makes it possible to provide a prism produced without using an adhesive.

Still other examples of optical members include long rods and large base materials for photomasks, for example.

In the embodiments described above, the gas is not limited to a gas for emitting plasma light and may be any type of gas for emitting light of wavelengths ranging from the vacuum ultraviolet region to the infrared region, such as excimer light.

The above embodiments make it possible to provide $CaF_2$ members of various shapes. The above embodiments also provide a method of producing $CaF_2$ members that makes it possible to easily produce these $CaF_2$ members of various shapes as well as a method of pressure-bonding $CaF_2$ crystals together.

The present invention is not limited to the embodiments described above, and various modifications may be made without departing from the spirit of the present invention. Other embodiments that embody the technical concepts of the present invention are also included within the scope of the present invention.

The invention claimed is:

1. A method of producing a calcium fluoride member, the method comprising:
    pressure-bonding together a first member made from monocrystalline calcium fluoride and a second member made from monocrystalline or polycrystalline calcium fluoride.

2. The method of producing the calcium fluoride member according to claim 1, wherein the second member is made from monocrystalline calcium fluoride.

3. The method of producing the calcium fluoride member according to claim 1,
    wherein in pressure-bonding, a pressure is applied to a contact surface between the first member and the second member, and the pressure is 2.1 to 5.8 MPa.

4. The method of producing the calcium fluoride member according to claim 3, wherein the pressure is 2.1 to 3.6 MPa.

5. The method of producing the calcium fluoride member according to claim 1,
    wherein pressure-bonding includes retaining the first member and the second member in an atmosphere of a prescribed temperature while applying pressure to a contact surface between the first member and the second member, and
    the prescribed temperature is 400 to 1100° C.

6. The method of producing the calcium fluoride member according to claim 5, wherein the prescribed temperature is 400 to 800° C.

7. The method of producing the calcium fluoride member according to claim 6, wherein the prescribed temperature is 400 to 500° C.

8. The method of producing the calcium fluoride member according to claim 1, wherein in pressure-bonding, a surface roughness of a prescribed surface of the first member that contacts the second member and a surface roughness of a prescribed surface of the second member that contacts the first member are both less than or equal to Ra=5 nm.

9. The method of producing the calcium fluoride member according to claim 1, wherein pressure-bonding is performed in an inert atmosphere or a vacuum atmosphere.

10. The method of producing the calcium fluoride member according to claim 1,
    wherein the first member and the second member both have a half-spherical shell made from monocrystalline calcium fluoride, and
    in pressure-bonding the first member and the second member together, the half-spherical shell of the first member and the half-spherical shell of the second member are pressure-bonded together to form a spherical shell made from monocrystalline calcium fluoride.

11. A method of pressure-bonding calcium fluoride crystals, the method comprising:
    bringing a prescribed surface of a first member made from monocrystalline calcium fluoride into contact with a prescribed surface of a second member made from monocrystalline calcium fluoride or polycrystalline calcium fluoride so as to define a contact surface between the prescribed surfaces; and
    applying a pressure of 2.1 to 5.8 MPa to the contact surface in an atmosphere of 400 to 1100° C.

12. The method of pressure-bonding calcium fluoride crystals according to claim 11, wherein a surface roughness of the prescribed surface of the first member and a surface roughness of the prescribed surface of the second member are both less than or equal to Ra=5 nm.

13. The method of pressure-bonding calcium fluoride crystals according to claim 11, wherein the pressure is applied in an inert atmosphere or a vacuum atmosphere.

* * * * *